(12) United States Patent
Wang et al.

(10) Patent No.: US 10,276,514 B1
(45) Date of Patent: Apr. 30, 2019

(54) SEMICONDUCTOR STRUCTURE AND MANUFACTURING METHOD THEREOF

(71) Applicant: Taiwan Semiconductor Manufacturing Co., Ltd., Hsinchu (TW)

(72) Inventors: Rung-De Wang, Kaohsiung (TW); Chen-Hsun Liu, Tainan (TW); Chin-Yu Ku, Hsinchu (TW); Te-Hsun Pang, Tainan (TW); Chia-Hua Wang, Tainan (TW); Pei-Shing Tsai, Tainan (TW); Po-Chang Lin, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/866,472

(22) Filed: Jan. 10, 2018

Related U.S. Application Data

(60) Provisional application No. 62/579,159, filed on Oct. 31, 2017.

(51) Int. Cl.
| | | |
|---|---|---|
| *H01L 21/78* | (2006.01) | |
| *H01L 23/00* | (2006.01) | |
| *H01L 23/31* | (2006.01) | |
| *H01L 23/48* | (2006.01) | |
| *H01L 21/768* | (2006.01) | |
| *H01L 21/782* | (2006.01) | |
| *H01L 21/784* | (2006.01) | |
| *H01L 23/498* | (2006.01) | |
| *H01L 23/522* | (2006.01) | |
| *H01L 23/538* | (2006.01) | |
| *H01L 21/8238* | (2006.01) | |

(52) U.S. Cl.
CPC ...... *H01L 23/562* (2013.01); *H01L 21/76898* (2013.01); *H01L 23/3142* (2013.01); *H01L 23/481* (2013.01); *H01L 23/5226* (2013.01); *H01L 21/78* (2013.01); *H01L 21/782* (2013.01); *H01L 21/784* (2013.01); *H01L 21/823871* (2013.01); *H01L 23/49827* (2013.01); *H01L 23/5384* (2013.01)

(58) Field of Classification Search
CPC . H01L 21/76898; H01L 21/78; H01L 21/782; H01L 21/784; H01L 21/823871; H01L 23/5226; H01L 23/49827; H01L 23/5384; H01L 23/562
See application file for complete search history.

(56) References Cited

U.S. PATENT DOCUMENTS 9,111,774 B2 * 8/2015 Chang ................ H01L 25/0657
9,431,350 B2 * 8/2016 Tang ................ H01L 21/76232
(Continued)

*Primary Examiner* — David A Zarneke
(74) *Attorney, Agent, or Firm* — JCIPRNET

(57) ABSTRACT

A semiconductor structure includes a semiconductor device, a first seal ring, a second seal ring, and a plurality of through semiconductor vias (TSV). The semiconductor device has a first surface and a second surface opposite to the first surface. The first seal ring is disposed on the first surface of the semiconductor device and is adjacent to edges of the first surface. The second seal ring is disposed on the second surface of the semiconductor device and is adjacent to edges of the second surface. The TSVs penetrate through the semiconductor device and physically connect the first seal ring and the second seal ring.

18 Claims, 14 Drawing Sheets

(56) References Cited

U.S. PATENT DOCUMENTS

| | | | |
|---|---|---|---|
| 9,899,333 B2* | 2/2018 | Tang .................... | H01L 23/562 |
| 2007/0090490 A1* | 4/2007 | Chang .................. | H01L 23/481 |
| | | | 257/621 |
| 2011/0175221 A1* | 7/2011 | Ni ........................ | B81B 7/0051 |
| | | | 257/737 |

* cited by examiner

SEMICONDUCTOR STRUCTURE AND MANUFACTURING METHOD THEREOF

CROSS-REFERENCE TO RELATED APPLICATION

This application claims the priority benefit of U.S. provisional application Ser. No. 62/579,159, filed on Oct. 31, 2017. The entirety of the above-mentioned patent application is hereby incorporated by reference herein and made a part of this specification.

BACKGROUND

Integrated circuits are used in a variety of electronic applications, such as personal computers, cell phones, digital cameras, and other electronic equipment. Integrated circuits are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be singulated to be packaged at wafer level. Seal ring formation is an important part in the back-end of line semiconductor processes. Seal rings are stress protection structures around integrated circuits, protecting the internal circuit inside semiconductor chips from damage caused by the dicing of the dies from wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
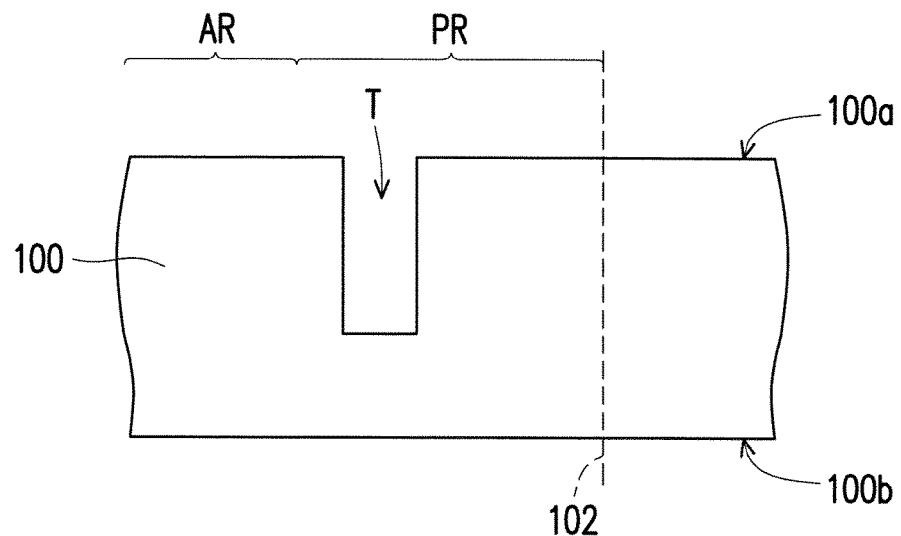
FIG. 1A to FIG. 1H are schematic cross-sectional views illustrating various stages in a manufacturing method of a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1H are schematic cross-sectional views illustrating various stages in a manufacturing method of a semiconductor structure 10 according to some embodiments of the present disclosure. It should be noted that the process presented in FIG. 1A to FIG. 1H is a wafer level process. Therefore, multiple units of the semiconductor structure 10 illustrated in FIG. 1A to FIG. 1H are simultaneously fabricated. It should be understood that FIG. 1A to FIG. 1H merely showed a portion of one single semiconductor structure 10 for illustration purposes.

Referring to FIG. 1A, a semiconductor device 100 is provided. In some embodiments, the semiconductor device 100 includes a wafer or a semiconductor substrate and a plurality of active or passive devices formed on the wafer or the semiconductor substrate. In some embodiments, the semiconductor device 100 includes an active region AR and a peripheral region PR surrounding the active region AR. The configuration of the active region AR and the peripheral region PR is exemplified in FIG. 2A to FIG. 2F. However, these illustrations construe no limitation in the present disclosure. The shape and the area of the active region AR and the peripheral region PR may take other forms as long as the peripheral region PR surrounds the active region AR. In some embodiments, the active devices (e.g., diodes and/or transistors), the passive devices (e.g., capacitors and/or resistors), and other devices are formed within the active region AR. On the other hand, the peripheral region PR may be free from having these devices formed therein.

As illustrated in FIG. 1A, the semiconductor device 100 includes a first surface 100a and a second surface 100b opposite to the first surface 100a. Moreover, a scribe line 112 is visible in FIG. 1A. The scribed line 112 denotes where the semiconductor device 100 is to be diced or sawed during the subsequent wafer singulation process. Referring to FIG. 1A, a plurality of trenches T (only one is shown in FIG. 1A) is formed in the peripheral region PR. In some embodiments, the trenches T are closely adjacent to the scribe line 112. The trenches T may be formed by performing an etching process on the semiconductor device 100 such that at least a portion of the semiconductor device 100 is removed. The etching process includes, for example, a dry etching process or a wet etching process. In some embodiments, each trenches T extends inward from the first surface 100a toward the second surface 100b.

Figure 1B:
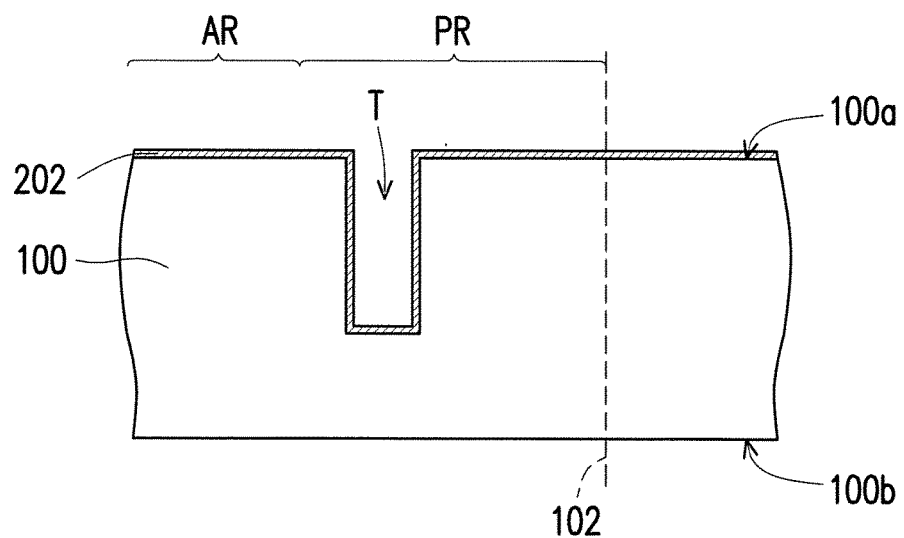

Referring to FIG. 1B, a seed layer material 202 is conformally formed over the first surface 100a of the semiconductor device 100. In some embodiments, the seed layer material 202 extends into the trenches T to cover sidewalls and bottom surfaces of the trenches T. The seed layer material 202 may be formed through, for example, a sputtering process, a physical vapor deposition (PVD) process, or the like. In some embodiments, the seed layer material 202 may include, for example, copper, titanium-copper alloy, or other suitable choice of materials.

Figure 1C:
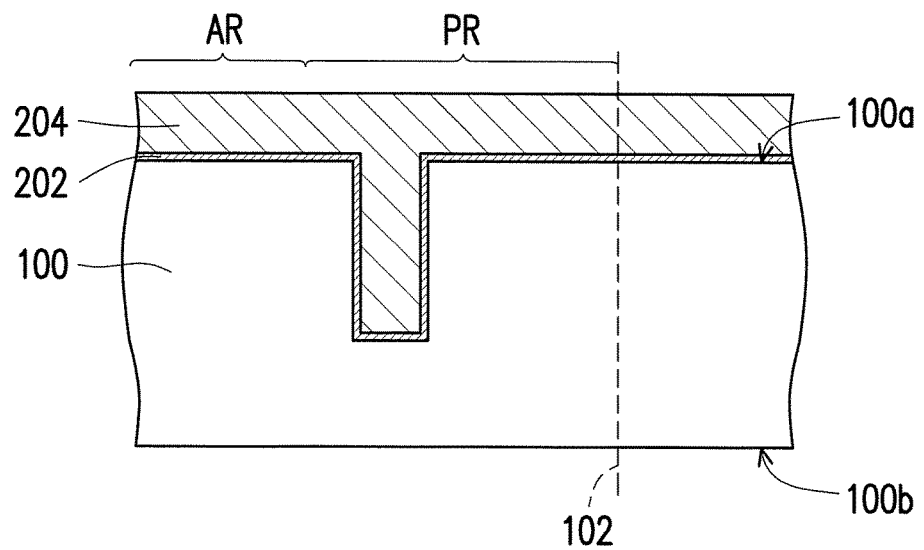

Referring to FIG. 1C, a conductive material 204 is formed over the seed layer material 202. In some embodiments, the conducive material 204 is deposited into the trenches T to fill up the trenches T. The conductive material 204 may be formed by, for example, a plating process. The plating process is, for example, electro-plating, electroless-plating, immersion plating, or the like. In some embodiments, the conductive material includes, for example, copper, copper alloys, or the like.

Figure 1D:
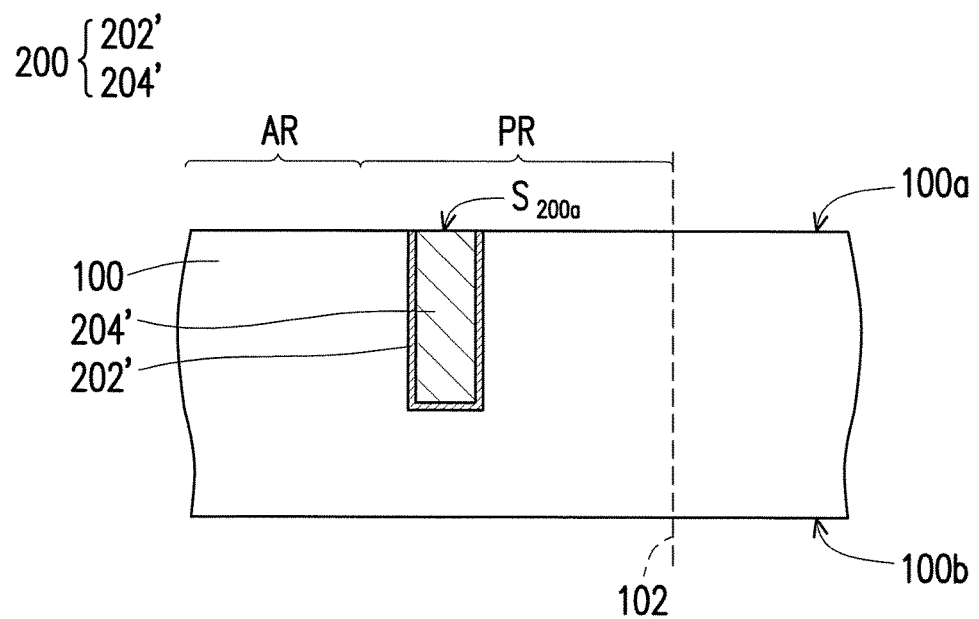
Figure 1E:
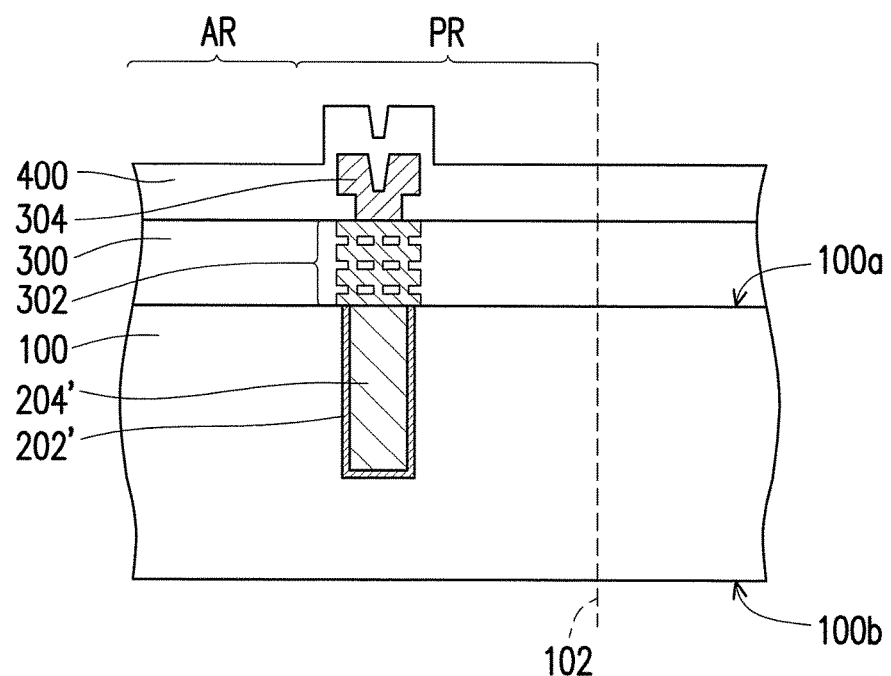

Referring to FIG. 1D, the seed layer material 202 and the conductive material 204 outside of the trenches T are removed to form a seed layer 202' surrounding a conducive layer 204'. In some embodiments, the excessive amount of the seed layer material 202 and the conductive material 204 may be removed through a mechanical grinding process and/or a chemical mechanical polishing (CMP) process. For example, in some embodiments, the structure illustrated in FIG. 1C is grinded until the first surface 100a of the semiconductor device 100 is exposed. In some embodiments, the seed layer 202' and the conductive layer 204' are collectively referred to as through semiconductor vias (TSV) 200. The TSVs 200 may take the form of polygonal columns, cylindrical columns, or elliptical columns. The dimensions and the shapes of the TSVs 200 will be discussed in greater detail later in conjunction with FIG. 4A to FIG. 4D. The TSVs 200 are embedded in the semiconductor device 100. Although FIG. 1D illustrated that a first surface $S_{200a}$ of the TSV 200 is substantially coplanar to the first surface 100a of the semiconductor device 100, the present disclosure is not limited thereto. In some alternative embodiments, due to the grinding selectivity difference between the semiconductor device 100, the seed layer material 202, and the conductive material 204, the rate of grinding for these materials may vary. As a result, the removing rate of the semiconductor device 100 may be faster or slower than the removing rates of the seed layer material 202 and the conductive material 204, causing the first surface $S_{200a}$ of the TSV 200 to locate at a level height higher or lower than the first surface 100a of the semiconductor device 100. It should be noted that the TSV 200 illustrated in FIG. 1E is formed within the peripheral region PR. Meanwhile, a plurality of TSVs (not shown) may be formed in the active region AR simultaneously by the same process. However, the plurality of TSVs formed in the active region AR is different from the TSV 200 formed in the peripheral region PR. For example, the TSVs formed in the active region AR are configured to transmit signals between the front side and the backside of the semiconductor device 100, so these TSVs are electrically connected to the active devices or the passive devices located in the active region AR. On the other hand, in some embodiments, the TSVs 200 in the peripheral region PR do not contribute to signal transmission, so the TSVs 200 located in the peripheral region PR may be electrically floating or electrically connected to a ground. In some embodiments, the TSVs 200 located in the peripheral region PR are electrically isolated from the TSVs and the devices located in the active region AR.

Referring to FIG. 1E, a first interconnection layer 300, a first top metal layer 304, and a passivation layer 130 are formed over the first surface 100a of the semiconductor device 100. The first interconnection layer 300 is formed by dielectric material layers and metallization layers layer by layer. In some embodiments, the first interconnection layer 300 may include more or less dielectric material layers and/or metallization layers as compared to the illustration shown in FIG. 1E. The number of metallization layers and the number of dielectric material layers may be adjusted depending on the routing requirement of the respective semiconductor structure. The material of the dielectric material layers in the first interconnection layer 300 includes polymer, polymide, benzocyclobutene (BCB), polybenzoxazole (PBO), or any other suitable dielectric material. The material of the metallization layers in the first interconnection layer 300 includes aluminum, titanium, copper, nickel, tungsten, and/or alloys thereof, but is not limited by the above-mentioned materials. In some embodiments, the first interconnection layer 300 includes a first seal ring structure 302 located in the peripheral region PR closely adjacent to the scribe line 102. The first seal ring structure 302 is formed from the dielectric material layers and metallization layers layer by layer as described above. Other portions of the first interconnection layer 300 may include interconnect structures not shown for other routing requirements of the devices formed in the active region AR of the semiconductor device 100.

As illustrated in FIG. 1E, the first top metal layer 304 is formed with the first interconnection layer 300 and is formed on the first seal ring structure 302. In some embodiments, the first top metal layer 304 may be made from aluminum, titanium, copper, nickel, tungsten, and/or alloys. The first top metal layer 304 and the first seal ring structure 302 are connected to form a first seal ring 306 on the first surface 100a of the semiconductor device 100. In some embodiments, the first seal ring structure 302 of the first seal ring 306 is physically in contact with the TSVs 200. Similar to the TSVs 200, in some embodiments, the first seal ring 306 is electrically floated or electrically grounded. In some embodiments, the passivation layer 400 is formed on the first interconnection layer 300 and covers the first top metal layer 304. In some embodiments, the material of the passivation layer 400 includes polyimide, epoxy resin, acrylic resin, phenol resin, benzocyclobutene (BCB), polybenzooxazole (PBO), or any other suitable polymer-based dielectric material. The passivation layer 400, for example, may be formed by suitable fabrication techniques such as spin-on coating, chemical vapor deposition (CVD), plasma-enhanced chemical vapor deposition (PECVD) or the like. In some embodiments, the passivation layer 400 and the first interconnection layer 300 are formed through any suitable back end of line (BEOL) process.

Figure 1F:
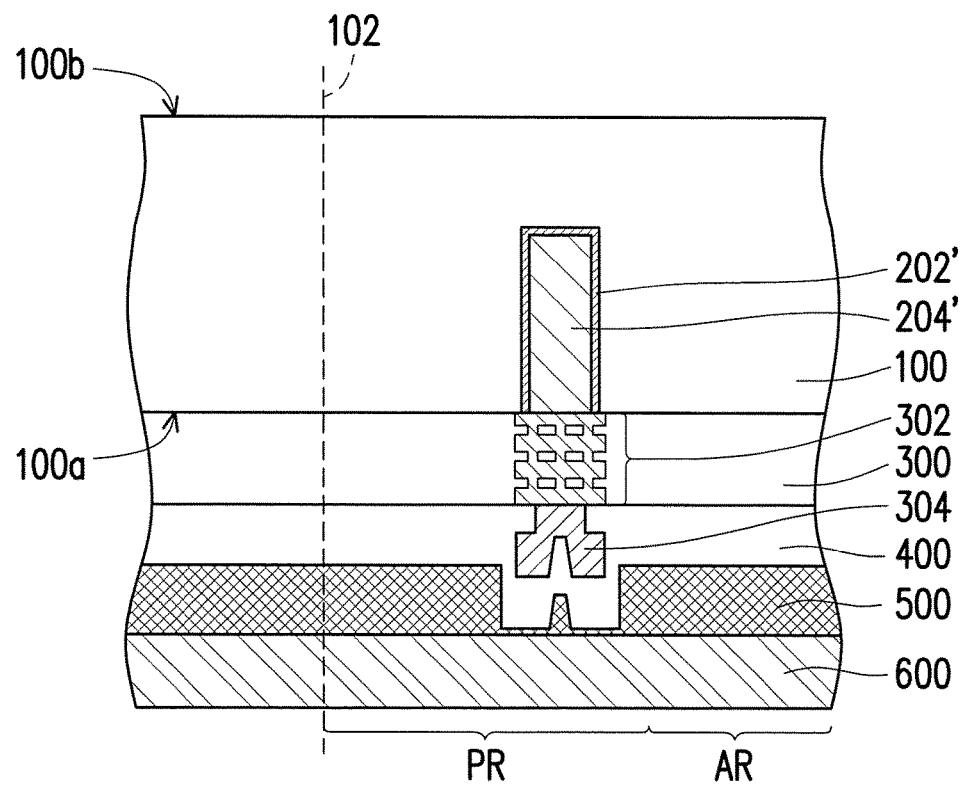

Referring to FIG. 1F, the structure illustrated in FIG. 1E is flipped upside down such that the second surface 100b of the semiconductor device 100 faces upward. In some embodiments, the flipped structure is attached to a carrier 600 through an adhesive layer 500. The adhesive layer 500 may be any material suitable for bonding the semiconductor device 100 onto the carrier 600. For example, the adhesive layer 500 may be an adhesive tape, an adhesive glue, or any other suitable material. In some embodiments, the carrier 600 may be a glass substrate. However, other material may be adapted as a material of the carrier 600 as long as the material is able to withstand the subsequent processes while carrying the semiconductor structure formed thereon.

Figure 1G:
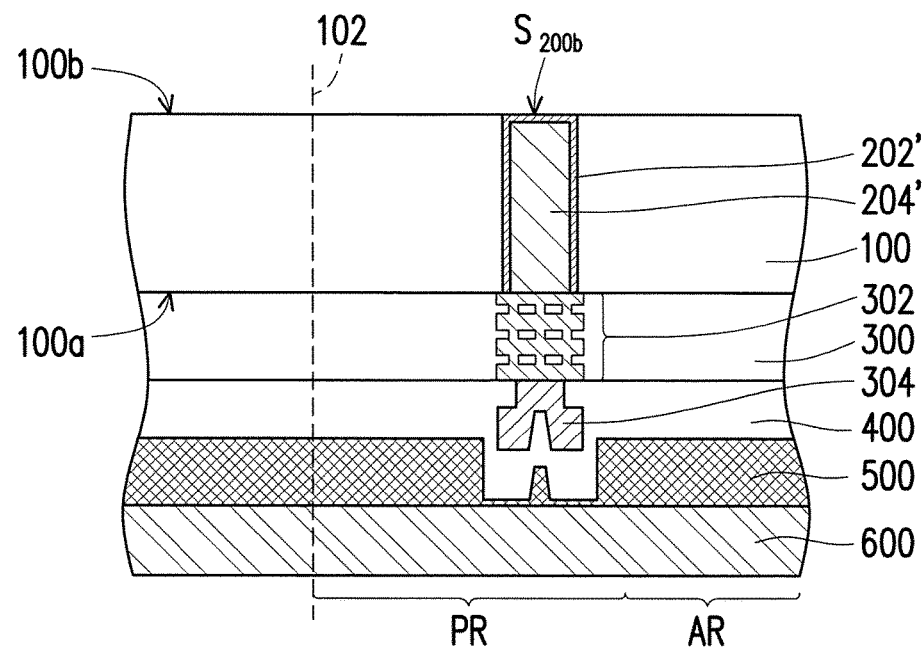

Referring to FIG. 1G, the semiconductor device 100 is thinned from the second surface 100b to expose the TSVs 200. For example, as illustrated in FIG. 1G, the thickness of the semiconductor device 100 is reduced to expose a second surface $S_{200b}$ of the TSV 200. In some embodiments, the semiconductor device 100 is thinned until the seed layer 202' is exposed. In some alternative embodiments, the semiconductor device 100 is thinned until the conducive layer 204' is exposed. For example, a portion of the seed layer 202' may be removed during the thinning process. In some embodiments, a portion of the semiconductor device 100 and/or the seed layer 202' may be removed through a mechanical grinding process and/or a chemical mechanical polishing (CMP) process. Although FIG. 1G illustrated that the second surface $S_{200b}$ of the TSV 200 is substantially coplanar to the second surface 100b of the semiconductor device 100, the present disclosure is not limited thereto. In some alternative embodiments, due to the grinding selectivity difference between the semiconductor device 100 and the seed layer 202', the rate of grinding for these materials may vary. As a result, the removing rate of the semiconductor device 100 may be faster or slower than the removing rates of the seed layer 202', causing the second surface $S_{200b}$ of the TSV 200 to locate at a level height higher or lower than the second surface 100b of the semiconductor device 100.

Figure 1H:
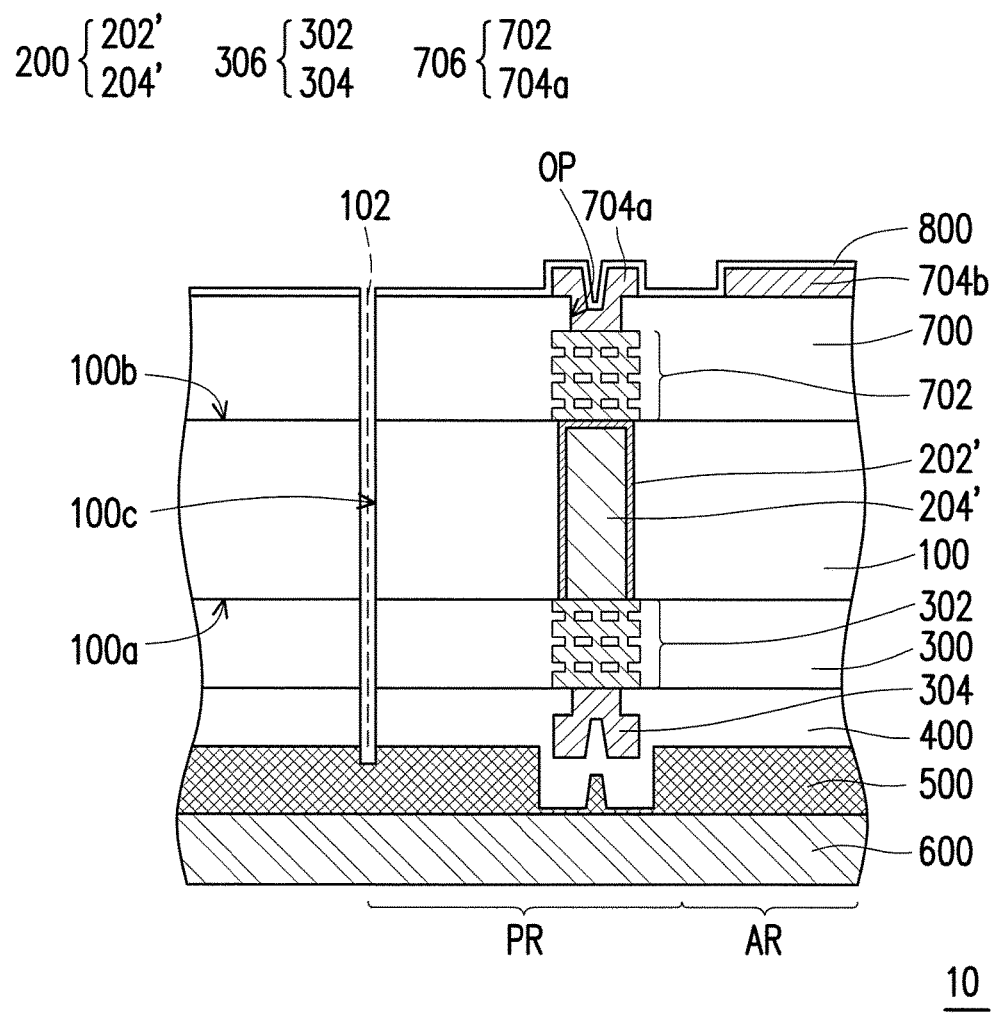

Referring to FIG. 1H, a second interconnection layer 700, a second top metal layer 704a, a backside metal routing 704b, and a passivation layer 800 are formed over the second surface 100b of the semiconductor device 100. The second interconnection layer 700 is formed by dielectric material layers and metallization layers layer by layer. In some embodiments, the second interconnection layer 700 may include more or less dielectric material layers and/or metallization layers as compared to the illustration shown in FIG. 1H. The number of metallization layers and the number of dielectric material layers may be adjusted depending on the routing requirement of the respective semiconductor structure. The material of the dielectric material layers in the second interconnection layer 700 includes polymer, polymide, benzocyclobutene (BCB), polybenzoxazole (PBO), or any other suitable dielectric material. The material of the metallization layers in the second interconnection layer 700 includes aluminum, titanium, copper, nickel, tungsten, and/or alloys thereof, but is not limited by the above-mentioned materials. In some embodiments, the second interconnection layer 700 includes a second seal ring structure 702 located in the peripheral region PR closely adjacent to the scribe line 102. The second seal ring structure 702 is formed from the dielectric material layers and metallization layers layer by layer as described above. Other portions of the second interconnection layer 700 may include interconnect structures not shown for other routing requirements of the devices formed in the active region AR of the semiconductor device 100.

In some embodiments, the second top metal layer 704a and the backside metal routing 704b may be formed by the following manner. First, an opening OP is formed in the second interconnection layer 700 to expose at least a portion of the second seal ring structure 702. Subsequently, a conductive material (not shown) is formed conforinally over the second interconnection layer 700, the opening OP, and the second seal ring structure 702. The conductive material may include, for example, aluminum, titanium, copper, nickel, tungsten, and/or alloys. Thereafter, a photolithography process and an etching process are performed on the conductive material. The conductive material is being patterned to form the second top metal layer 704a in the peripheral region PR and the backside metal routing 704b in the active region AR. In some embodiments, backside metal routing 704b may be adapted to transmit signal originated from the devices located in the active region AR. The second top metal layer 704a is electrically isolated from the backside metal routing 704b. The second top metal layer 704a and the second seal ring structure 702 are connected to form a second seal ring 706 on the second surface 100b of the semiconductor device 100. In some embodiments, the second seal ring structure 702 of the second seal ring 706 is physically in contact with the TSVs 200. Similar to the TSVs 200, in some embodiments, the second seal ring 706 is electrically floated or electrically grounded.

As illustrated in FIG. 1H, the passivation layer 800 is formed over the second interconnection layer 700 and covers the second top metal layer 704a and the backside metal routing 704b. Similar to the passivation layer 400, the material of the passivation layer 800 may also include polyimide, epoxy resin, acrylic resin, phenol resin, benzocyclobutene (BCB), polybenzooxazole (PBO), or any other suitable polymer-based dielectric material. The passivation layer 800, for example, may be formed by suitable fabrication techniques such as spin-on coating, chemical vapor deposition (CVD), plasma-enhanced chemical vapor deposition (PECVD) or the like.

After the formation of the passivation layer 800, the structure illustrated in FIG. 1H is diced along the scribe line 102 to form the semiconductor structure 10. After the singulation process, the semiconductor structure 10 is separated from the carrier 600. The semiconductor structure 10 may be separated from the carrier 600 by, for example, a de-bonding process. During the de-bonding process, the adhesiveness in the adhesive layer 500 may be reduced through thermal process, chemical process, or any other suitable process. Subsequently, the semiconductor structure 10 may be removed from the adhesive layer 500 through any suitable pickup mechanism. In some embodiments, the semiconductor structures 10 that are de-bonded may then undergo a packaging process.

Figure 2A:
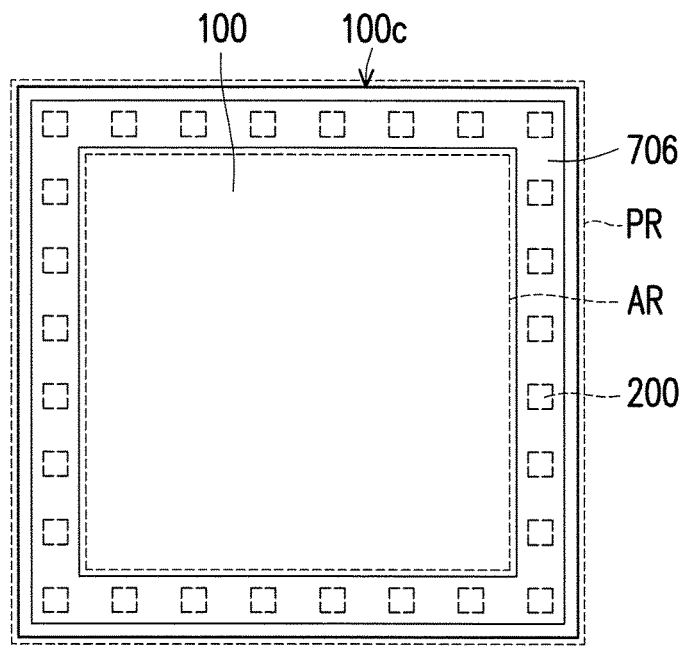
FIG. 2A is a schematic backside view of the semiconductor structure in FIG. 1H.

FIG. 2A is a schematic backside view of the semiconductor structure 10 in FIG. 1H. For simplicity, some elements are omitted in the backside view of FIG. 2A. FIG. 2A mainly focuses on the second seal ring 706 and the TSVs 200 to demonstrate the relative configurations of these elements. Referring to FIG. 2A and FIG. 1H, the semiconductor structure 10 includes the semiconductor device 110 having the first surface 110a and the second surface 110b opposite to the first surface 110a. The semiconductor structure 10 also includes the first seal ring 306, the second seal ring 706, and the TSVs 200. The second seal ring 706 is disposed on the second surface 100b of the semiconductor device 110 and adjacent to edges 100c of the second surface 100b. In some embodiments, the second seal ring 706 is a single seal ring loop pattern, as illustrated in FIG. 2A. However, it construes no limitation in the present disclosure. In some alternative embodiments, the second seal ring 706 may be a multiple seal ring loop pattern, which will be discuss in greater detail later. In some alternative embodiments, the second seal ring 706 is not a closed loop and may include openings which disrupt the seal ring pattern from a plan view. As illustrated in FIG. 2A, the second seal ring 706 is located in the peripheral region PR and surrounds the active region AR. In some embodiments, the TSVs 200 are completely covered/shielded by the second seal ring 706.

The first seal ring 306 is disposed on the first surface 110a of the semiconductor device 110 and adjacent to edges 100c of the first surface 110a. In some embodiments, the first seal ring 306 may have the same contour as that of the second seal ring 706. That is, the first seal ring 306 is also a single seal ring loop pattern and the front side view of the semiconductor structure 10 may look identical to the illustration presented in FIG. 2A except that the first seal ring 306 is visible rather than the second seal ring 706. However, the present disclosure is not limited thereto. In some alternative embodiments, the first seal ring 306 may take forms or shapes different from that of the second seal ring 706. In some embodiments, the TSVs 200 penetrate through the semiconductor device 100 and physically connect the seal ring loop pattern of the first seal ring 306 and the seal ring loop pattern of the second seal ring 706.

The first seal ring 306, the second seal ring 706, and the TSVs 200 are located in the peripheral region PR. Therefore, during the singulation/dicing process, as the semiconductor device 110 is sawed or cut at the scribe line 112, the first seal ring 306, the second seal ring 706, and the TSVs 200 may aid to stop undesirable damage or cracks toward the devices and the metallization routings located in the active region AR. Furthermore, the first seal ring 306, the second seal ring 706, and the TSVs 200 may enable structural reinforcement of the semiconductor structure 10, so as to ensure the reliability of the semiconductor structures 10.

FIG. 2B to FIG. 2F are schematic backside views illustrating various semiconductor structures 20, 30, 40, 50, 60 according to some alternative embodiments of the present disclosure. It should be noted that in some embodiments, the front side views of the semiconductor structures 20, 30, 40, 50, 60 may look identical to the backside views presented in FIG. 2B to FIG. 2F except that the first seal ring 306 is visible rather than the second seal ring 706.

Figure 2B:
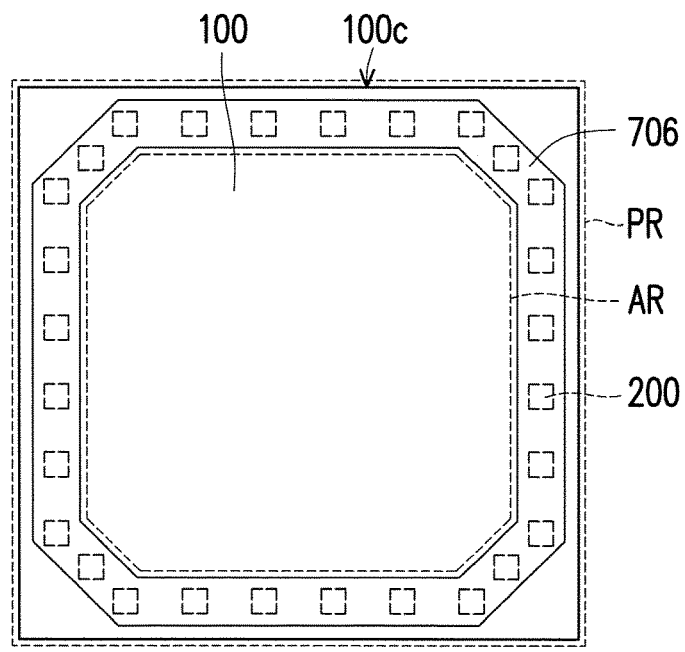
FIG. 2B to FIG. 2F are schematic backside views illustrating various semiconductor structures according to some alternative embodiments of the present disclosure.

Referring to FIG. 2B, the semiconductor structure 20 illustrated in FIG. 2B is similar to the semiconductor structure 10 illustrated in FIG. 2A, so similar elements are denoted by the same reference numeral and the detailed descriptions thereof are omitted herein. In the semiconductor structure 20 of FIG. 2B, the TSVs 200 are configured to avoid the corners of the semiconductor structure 20. For example, the TSVs 200 are arranged in a manner such that no TSVs 200 is located at the corners of the semiconductor structure 20. Similarly, the second seal ring 706 and the first seal ring 306 are also configured to avoid the corners of the semiconductor structure 20. In some embodiments, the second seal ring 706 and the first seal ring 306 are respectively an octagonal ring from a plan view. In some embodiments, during the dicing/singulating process, the corners of the semiconductor structure 20 are subjected to more stress as compared to other parts of the semiconductor structure 20. As such, by arranging the TSVs 200, the first seal ring 306, and the second seal ring 706 to ward off from the corners of the semiconductor structure 20, the defects derived from stress may be sufficiently prevented.

Figure 2C:
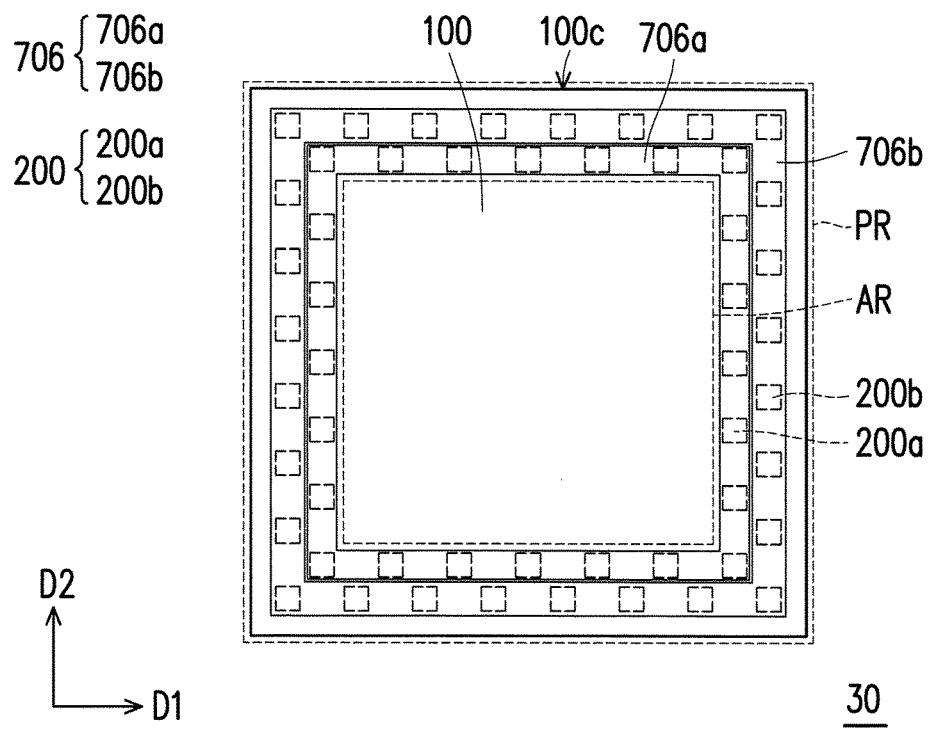
Figure 3A:
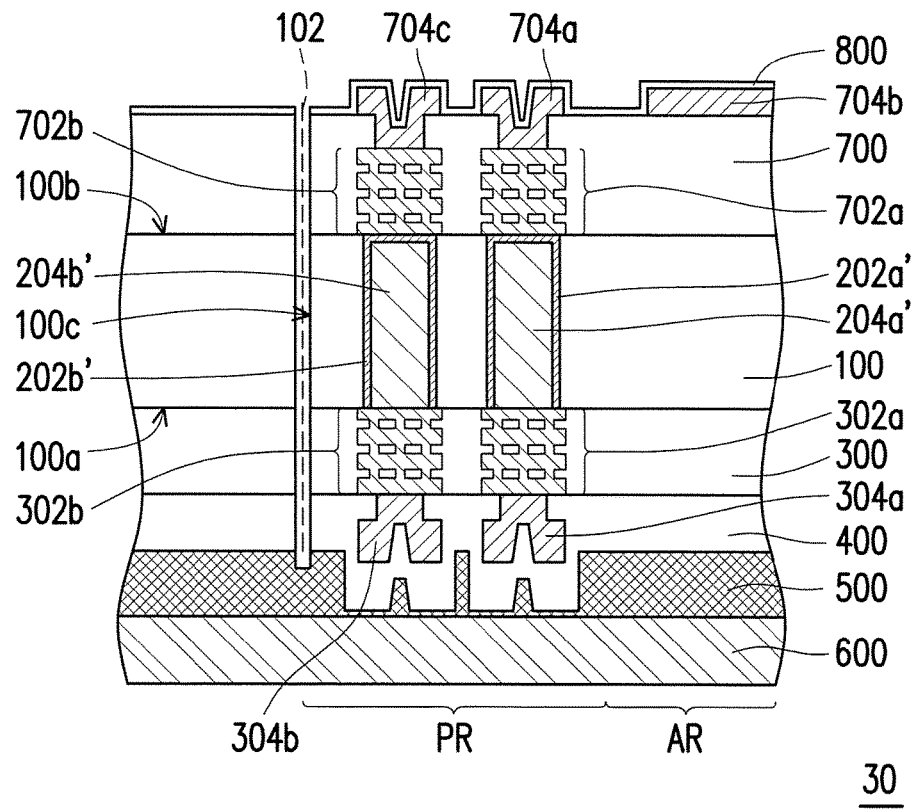
FIG. 3A is a schematic cross-sectional view of the semiconductor structure in FIG. 2C.

FIG. 3A is a schematic cross-sectional view of the semiconductor structure 30 in FIG. 2C. Referring to FIG. 3A and FIG. 2C, the semiconductor structure 30 illustrated in FIG. 3A and FIG. 2C is similar to the semiconductor structure 10 illustrated in FIG. 1H and FIG. 2A, so similar elements are denoted by the same reference numeral and the detailed descriptions thereof are omitted herein. In the semiconductor structure 30 of FIG. 3A and FIG. 2C, the second seal ring 706 may be a multiple seal ring loop pattern. For example, the second seal ring 706 may include a first seal ring loop pattern 706a and a second seal ring loop pattern 706b surrounding the first seal ring loop pattern 706a. The first seal ring loop pattern 706a may be constituted by a second top metal layer 704a and a second seal ring structure 702a.

Similarly, the second seal ring loop pattern 706b may be constituted by a second top metal layer 704c and a second seal ring structure 702b. In some embodiments, the TSVs 200 may be divided into a first portion and a second portion. The first portion includes a plurality of first TSVs 200a and the second portion includes a plurality of second TSVs 200b. The first TSVs 200a may be constituted by a first seed layer 202a' and a first conductive layer 204a'. Similarly, the second TSVs 200b may be constituted by a second seed layer 202b' and a second conductive layer 204b'. In some embodiments, the first TSVs 200a and the second TSVs 200b are arranged in a staggered manner. For example, at least part of the first TSVs 200a may be arranged along a first direction D1 and at least part of the second TSVs 200b may be arranged along the first direction D1 on a different row. Along a second direction D2 perpendicular to the first direction D1, these first TSVs 200a and these second TSVs 200b are not overlapped with each other.

In some embodiments, the first seal ring 306 may have the same contour as that of the second seal ring 706. That is, the first seal ring 306 is also a multiple seal ring loop pattern and the front side view of the semiconductor structure 30 may look identical to the illustration presented in FIG. 2C except that the first seal ring 306 is visible rather than the second seal ring 706. For example, the first seal ring 306 may include a first seal ring loop pattern 306a and a second seal ring loop pattern 306b surrounding the first seal ring loop pattern 306a. The first seal ring loop pattern 306a may be constituted by a first top metal layer 304a and a first seal ring structure 302a. Similarly, the second seal ring loop pattern 306b may be constituted by a first top metal layer 304b and a first seal ring structure 302b. In some embodiments, the first TSVs 200a physically connect the first seal ring loop pattern 306a of the first seal ring 306 and the first seal ring loop pattern 706a of the second seal ring 706, and the second TSVs 200b physically connect the second seal ring loop pattern 306b of the first seal ring 306 and the second seal ring loop pattern 706b of the second seal ring 706. In some embodiments, the first TSVs 200a are disposed corresponding to the first seal ring loop patterns 306a, 706a and the second TSVs 200b are disposed corresponding to the second seal ring loop patterns 306b, 706b. For example, the first TSVs 200a are completely covered/shielded by the first seal ring loop patterns 306a, 706a and the second TSVs 200b are completely covered/shielded by the second seal ring loop patterns 306b, 706b. Since the first TSVs 200a and the second TSVs 200b are arranged in a staggered manner, during the singulation/dicing process, as the semiconductor device 110 is sawed or cut at the scribe line 112, the first TSVs 200a may further stop undesirable damage or cracks that escapes through the spacing between two adjacent second TSVs 200b, thereby further enhancing the structural reinforcement of the semiconductor structure 30.

Figure 2D:
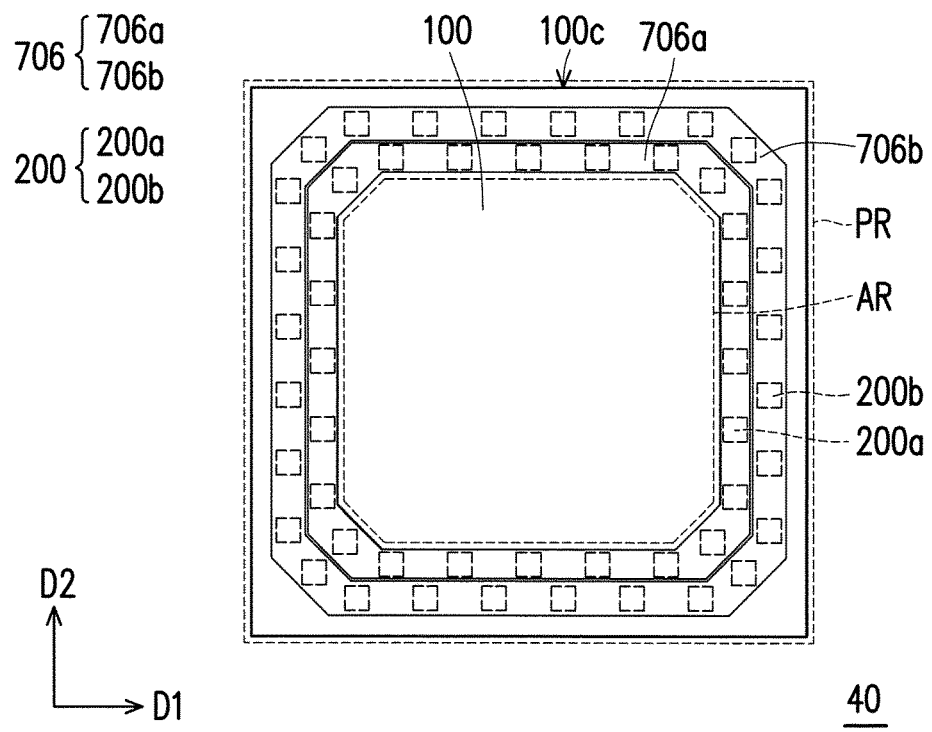

Referring to FIG. 2D, the semiconductor structure 40 illustrated in FIG. 2D is similar to the semiconductor structure 30 illustrated in FIG. 2C, so similar elements are denoted by the same reference numeral and the detailed descriptions thereof are omitted herein. In the semiconductor structure 40 of FIG. 2D, the TSVs 200 are configured to avoid the corners of the semiconductor structure 20. For example, the TSVs 200 are arranged in a manner such that no TSVs 200 is located at the corners of the semiconductor structure 40. Similarly, the second seal ring 706 and the first seal ring 306 are also configured to avoid the corners of the semiconductor structure 40. In some embodiments, the second seal ring 706 and the first seal ring 306 are respectively an octagonal ring from a plan view. In some embodiments, during the dicing/singulationg process, the corners of the semiconductor structure 40 are subjected to more stress as compared to other parts of the semiconductor structure 40. As such, by arranging the TSVs 200, the first seal ring 306, and the second seal ring 706 to ward off from the corners of the semiconductor structure 40, the defects derived from stress may be sufficiently prevented.

Figure 2E:
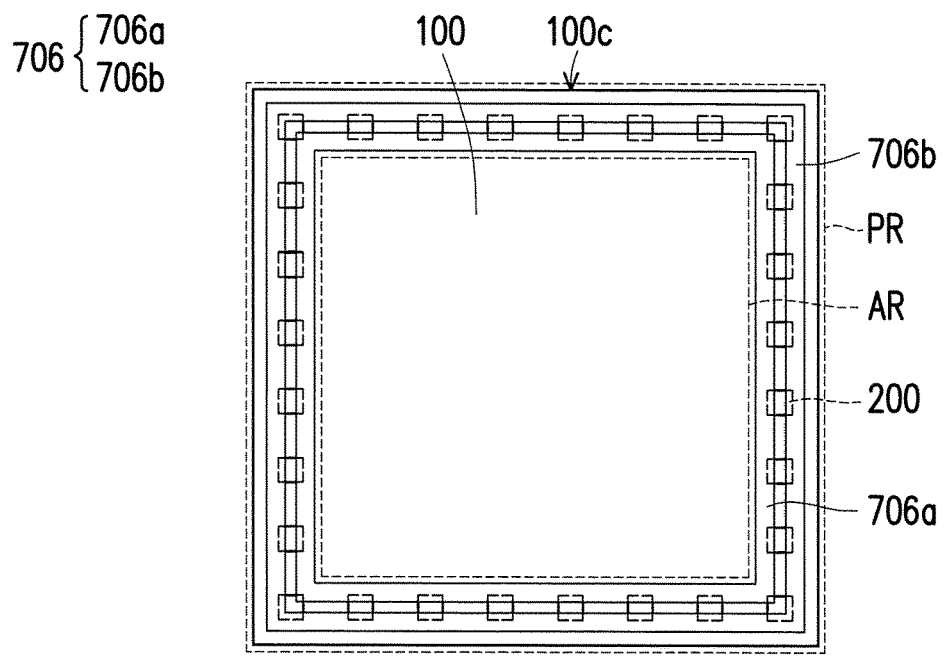
Figure 3B:
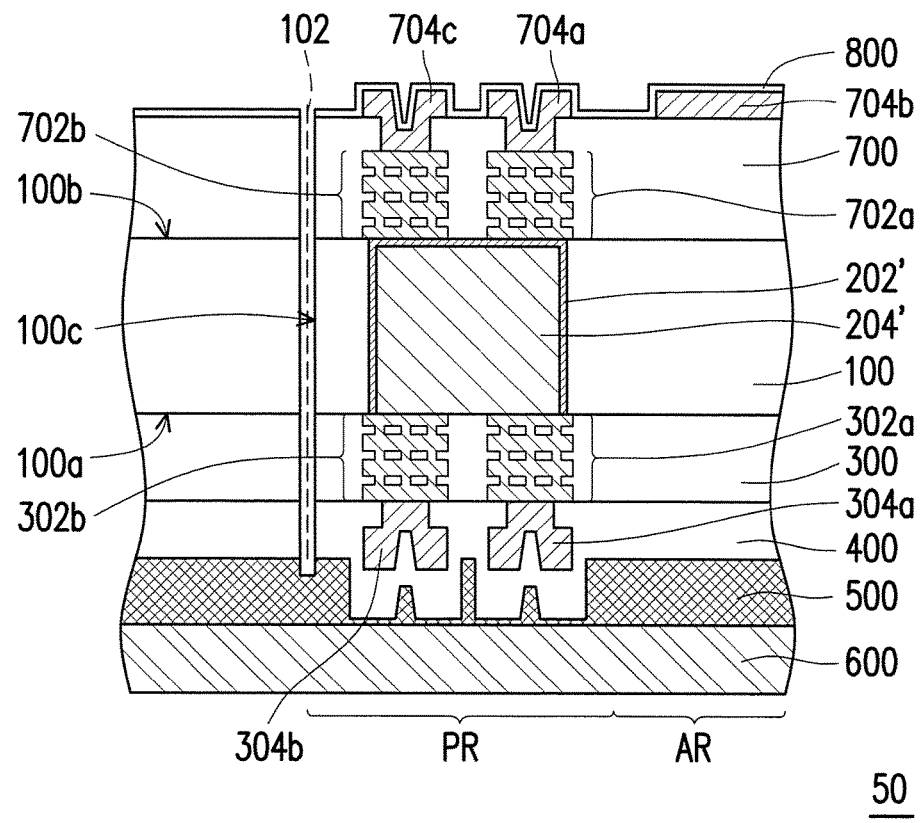
FIG. 3B is a schematic cross-sectional view of the semiconductor structure in FIG. 2E.

FIG. 3B is a schematic cross-sectional view of the semiconductor structure 50 in FIG. 2E. Referring to FIG. 3B and FIG. 2E, the semiconductor structure 50 illustrated in FIG. 3B and FIG. 2E is similar to the semiconductor structure 30 illustrated in FIG. 3A and FIG. 2C, so similar elements are denoted by the same reference numeral and the detailed descriptions thereof are omitted herein. In the semiconductor structure 50 of FIG. 3B and FIG. 2E, each of the TSVs 200 is partially exposed by the first seal ring loop patterns 306a, 706a and the second seal ring loop patterns 306b, 706b. For example, as illustrated in FIG. 3B, each TSV 200 is physically connected to the first seal ring loop pattern 306a of the first seal ring 306, the second seal ring loop pattern 306b of the first seal ring 306, the first seal ring loop pattern 706a of the second seal ring 706, and the second seal ring loop pattern 706b of the second seal ring 706. Since each of the TSVs 200 is connected to two seal ring patterns, the structural reinforcement of the semiconductor structure 50 may be further enhanced. For example, during the singulation/dicing process, as the semiconductor device 110 is sawed or cut at the scribe line 112, the first seal ring 306, the second seal ring 706, and the TSVs 200 may aid to stop undesirable damage or cracks toward the devices and the metallization routings located in the active region AR.

Figure 2F:
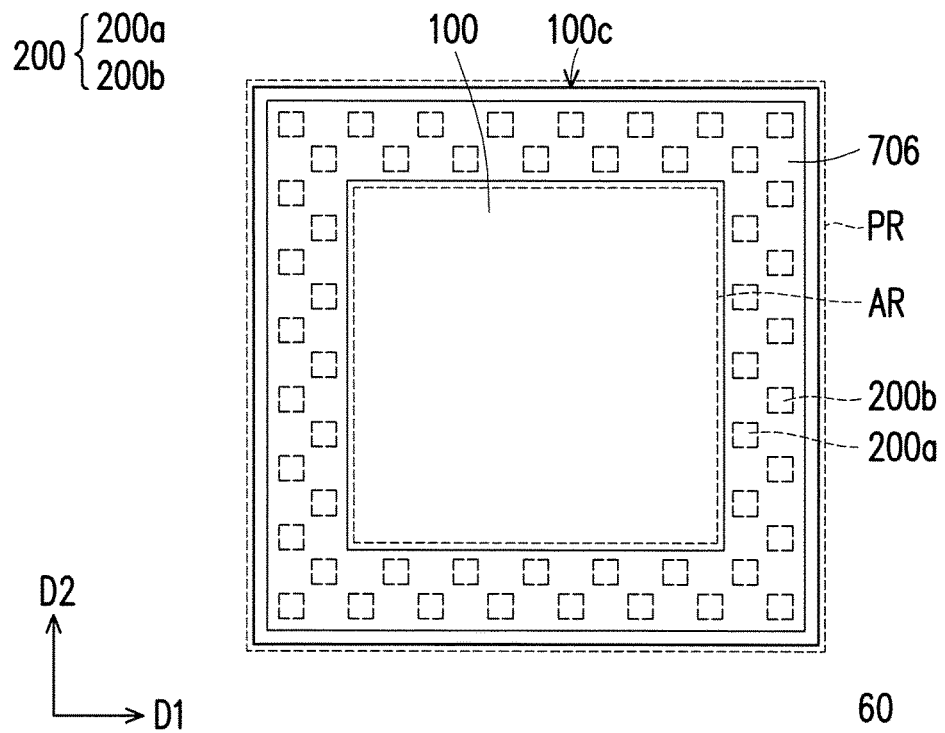
Figure 3C:
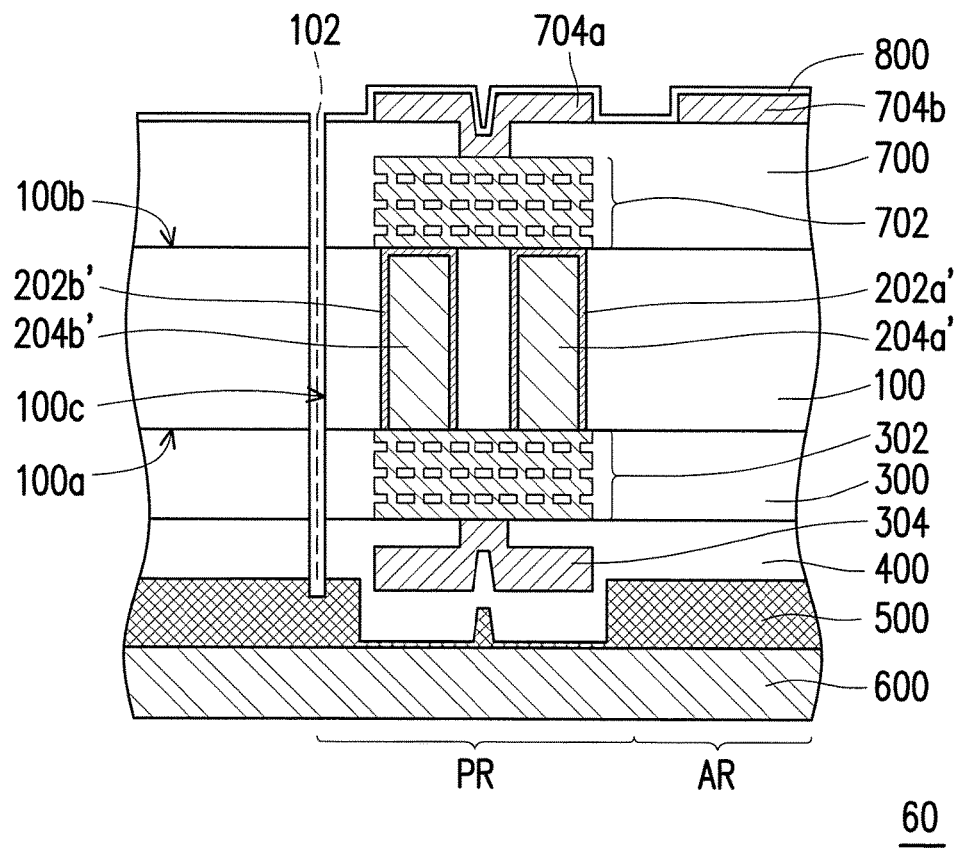
FIG. 3C is a schematic cross-sectional view of the semiconductor structure in FIG. 2F.

FIG. 3C is a schematic cross-sectional view of the semiconductor structure 60 in FIG. 2F. Referring to FIG. 3C and FIG. 2F, the semiconductor structure 60 illustrated in FIG. 3C and FIG. 2F is similar to the semiconductor structure 30 illustrated in FIG. 3A and FIG. 2C, so similar elements are denoted by the same reference numeral and the detailed descriptions thereof are omitted herein. In the semiconductor structure 60 of FIG. 3C and FIG. 2F, the first seal ring 306 and the second seal ring 706 are respectively a single seal ring loop pattern. Both of the first TSVs 200a and the second TSVs 200b correspond to the single seal ring loop pattern of the first seal ring 306 and the second seal ring 706. For example, as illustrated in FIG. 3C, both of the first TSV 200a and the second TSV 200b physically connect the seal ring loop pattern of the first seal ring 306 and the seal ring loop pattern of the second seal ring 706. Since each of the seal ring loop pattern is connected to two TSVs 200, the structural reinforcement of the semiconductor structure 60 may be further enhanced. For example, during the singulation/dicing process, as the semiconductor device 110 is sawed or cut at the scribe line 112, the first seal ring 306, the second seal ring 706, and the TSVs 200 may aid to stop undesirable damage or cracks toward the devices and the metallization routings located in the active region AR.

FIG. 4A to FIG. 4D are schematic enlarged backside views illustrating dimensions and arrangements of various through semiconductor vias (TSV) 200 according to some embodiments of the present disclosure. The dimensions and the shapes of the TSVs 200 will be discussed below.

Figure 4A:
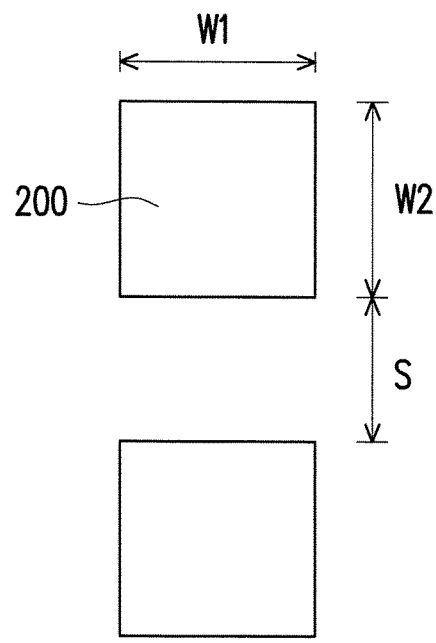
FIG. 4A to FIG. 4D are schematic enlarged backside views illustrating dimensions and arrangements of various through semiconductor vias (TSV) according to some embodiments of the present disclosure.

Referring to FIG. 4A, in some embodiments, the TSVs 200 may be square columns. For example, from a plan view, the shape of each TSV 200 is a square. However, the disclosure is not limited thereto. In some alternative embodiments, the TSVs 200 may be rectangular columns. In some embodiments, each TSV 200 has a width of W1 and a width of W2. The width W1 and the width W2 may respectively range between 1 μm and 100 μm. In some embodiments, a minimum distance S between two adjacent TSVs 200 may range between 1 μm and 100 μm.

Figure 4B:
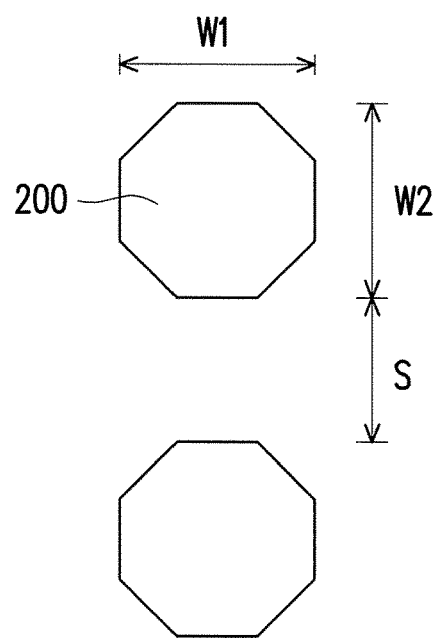

Referring to FIG. 4B, in some embodiments, the TSVs 200 may be octagonal columns. For example, from a plan view, the shape of each TSV 200 is an octagon. In some embodiments, each TSV 200 has a width of W1 and a width of W2. The width W1 and the width W2 may respectively range between 1 μm and 100 μm. In some embodiments, a minimum distance S between two adjacent TSVs 200 may range between 1 μm and 100 μm.

Figure 4C:
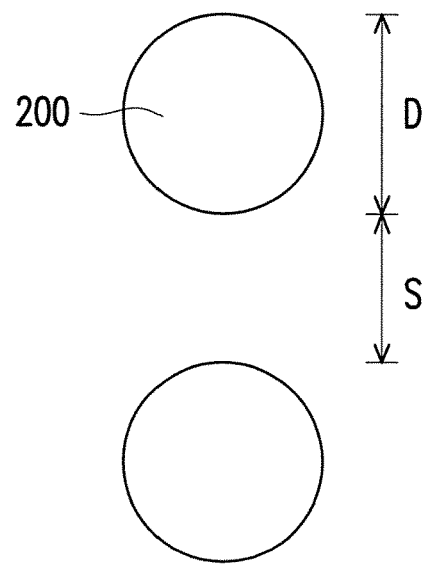

Referring to FIG. 4C, in some embodiments, the TSVs 200 may be cylindrical columns. For example, from a plan view, the shape of each TSV 200 is a circle. In some embodiments, each TSV 200 has a diameter of D. The diameter D may range between 1 μm and 100 μm. In some embodiments, a minimum distance S between two adjacent TSVs 200 may range between 1 μm and 100 μm.

Figure 4D:
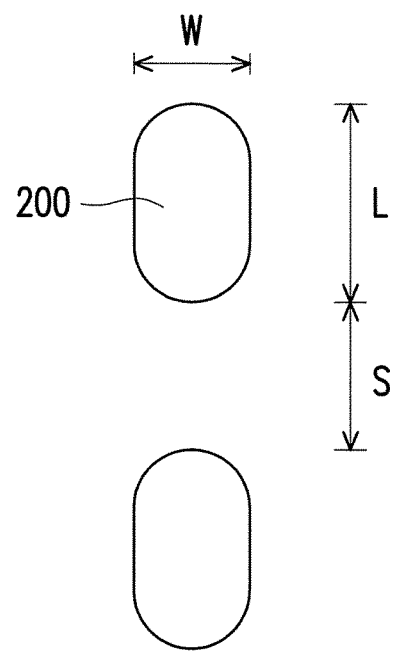

Referring to FIG. 4D, in some embodiments, the TSVs 200 may be elliptical columns. For example, from a plan view, the shape of the TSV 200 is an ellipse. In some embodiments, each TSV 200 has a width of W and a length of L. The width W and the length L may respectively range between 1 μm and 100 μm. In some embodiments, a minimum distance S between two adjacent TSVs 200 may range between 1 μm and 100 μm.

In accordance with some embodiments of the disclosure, a semiconductor structure includes a semiconductor device, a first seal ring, a second seal ring, and a plurality of through semiconductor vias (TSV). The semiconductor device has a first surface and a second surface opposite to the first surface. The first seal ring is disposed on the first surface of the semiconductor device and is adjacent to edges of the first surface. The second seal ring is disposed on the second surface of the semiconductor device and is adjacent to edges of the second surface. The TSVs penetrate through the semiconductor device and physically connect the first seal ring and the second seal ring.

In accordance with some alternative embodiments of the disclosure, a semiconductor structure includes a semiconductor device, a first interconnection layer, a second interconnection layer, and a plurality of through semiconductor vias (TSV). The semiconductor device has a first surface and a second surface opposite to the first surface. The semiconductor device includes an active region and a peripheral region surrounding the active region. The first interconnection layer is disposed on the first surface of the semiconductor device and includes a first seal ring located in the peripheral region. The second interconnection layer is disposed on the second surface of the semiconductor device and includes a second seal ring located in the peripheral region. The TSVs penetrate through the semiconductor device. The TSVs physically connect the first seal ring and the second seal ring.

In accordance with some embodiments of the disclosure, a method of manufacturing a semiconductor structure includes at least the following steps. A semiconductor device having a first surface and a second surface opposite to the first surface is provided. A plurality of through semiconductor vias (TSV) embedded in the semiconductor device is formed. A first seal ring is formed over the first surface of the semiconductor device. The first seal ring is adjacent to edges of the first surface and is physically in contact with the TSVs. A second seal ring is formed over the second surface of the semiconductor device. The second seal ring is adjacent to edges of the second surface and is physically in contact with the TSVs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor device having a first surface and a second surface opposite to the first surface;
   a first seal ring, disposed on the first surface of the semiconductor device and adjacent to edges of the first surface;
   a second seal ring, disposed on the second surface of the semiconductor device and adjacent to edges of the second surface; and
   a plurality of through semiconductor vias (TSV) penetrating through the semiconductor device, wherein the plurality of TSVs physically connects the first seal ring and the second seal ring.

2. The semiconductor structure according to claim 1, wherein the plurality of TSVs comprises polygonal columns, cylindrical columns, or elliptical columns.

3. The semiconductor structure according to claim 2, wherein a width or a diameter of each TSV ranges between 1 μm and 100 μm, and a minimum distance between two adjacent TSVs ranges between 1 μm and 100 μm.

4. The semiconductor structure according to claim 1, wherein the first seal ring and the second seal ring are respectively a single seal ring loop pattern.

5. The semiconductor structure according to claim 4, wherein the plurality of TSVs physically connects the seal ring loop pattern of the first seal ring and the seal ring loop pattern of the second seal ring.

6. The semiconductor structure according to claim 1, wherein the first seal ring and the second seal ring are respectively a multiple seal ring loop pattern, the multiple seal ring loop pattern comprises a first seal ring loop pattern and a second seal ring loop pattern surrounding the first seal ring loop pattern.

7. The semiconductor structure according to claim 6, wherein a first portion of the plurality of TSVs physically connects the first seal ring loop pattern of the first seal ring and the first seal ring loop pattern of the second seal ring, and a second portion of the plurality of TSVs physically connects the second seal ring loop pattern of the first seal ring and the second seal ring loop pattern of the second seal ring.

8. The semiconductor structure according to claim 7, wherein the first portion of the plurality of TSVs and the second portion of the plurality of the TSVs are arranged in a staggered manner.

9. The semiconductor structure according to claim 6, wherein each of the plurality of TSVs is physically connected to the first seal ring loop pattern of the first seal ring, the second seal ring loop pattern of the first seal ring, the first seal ring loop pattern of the second seal ring, and the second seal ring loop pattern of the second seal ring.

10. A semiconductor structure, comprising:
    a semiconductor device having a first surface and a second surface opposite to the first surface, wherein the semiconductor device comprises an active region and a peripheral region surrounding the active region;
    a first interconnection layer, disposed on the first surface of the semiconductor device, wherein the first interconnection layer comprises a first seal ring located in the peripheral region;
    a second interconnection layer, disposed on the second surface of the semiconductor device, wherein the second interconnection layer comprises a second seal ring located in the peripheral region; and
    a plurality of through semiconductor vias (TSV) penetrating through the semiconductor device, wherein the plurality of TSVs physically connects the first seal ring and the second seal ring.

11. The semiconductor structure according to claim 10, wherein the plurality of TSVs comprises polygonal columns, cylindrical columns, or elliptical columns.

12. The semiconductor structure according to claim 11, wherein a width or a diameter of each TSV ranges between 1 μm and 100 μm, and a minimum distance between two adjacent TSVs ranges between 1 μm and 100 μm.

13. The semiconductor structure according to claim 10, wherein the first seal ring and the second seal ring are respectively a single seal ring loop pattern.

14. The semiconductor structure according to claim 13, wherein the plurality of TSVs physically connects the seal ring loop pattern of the first seal ring and the seal ring loop pattern of the second seal ring.

15. The semiconductor structure according to claim 10, wherein the first seal ring and the second seal ring are respectively a multiple seal ring loop pattern, the multiple seal ring loop pattern comprises a first seal ring loop pattern and a second seal ring loop pattern surrounding the first seal ring loop pattern.

16. The semiconductor structure according to claim 15, wherein a first portion of the plurality of TSVs physically connects the first seal ring loop pattern of the first seal ring and the first seal ring loop pattern of the second seal ring, and a second portion of the plurality of TSVs physically connects the second seal ring loop pattern of the first seal ring and the second seal ring loop pattern of the second seal ring.

17. The semiconductor structure according to claim 16, wherein the first portion of the plurality of TSVs and the second portion of the plurality of the TSVs are arranged in a staggered manner.

18. The semiconductor structure according to claim 15, wherein each of the plurality of TSVs is physically connected to the first seal ring loop pattern of the first seal ring, the second seal ring loop pattern of the first seal ring, the first seal ring loop pattern of the second seal ring, and the second seal ring loop pattern of the second seal ring.

* * * * *